United States Patent [19]
Mann

[11] 3,733,691
[45] May 22, 1973

[54] PROCESS FOR MAKING SEMICONDUCTOR DEVICES

[75] Inventor: Helmut Mann, Osnabrueck, Germany

[73] Assignee: Kabel-und Metallwerke Gutehoffnungshutte Aktiengesellschaft, Hanover, Germany

[22] Filed: Oct. 7, 1968

[21] Appl. No.: 765,503

[52] U.S. Cl.....................................29/588, 29/470.1
[51] Int. Cl................................................B01j 17/00
[58] Field of Search..............................29/588, 470.1

[56] References Cited

UNITED STATES PATENTS

| | | | |
|---|---|---|---|
| 3,005,867 | 10/1961 | Green et al. | 29/588 X |
| 3,024,519 | 3/1962 | Leinkram et al. | 29/470.1 UX |
| 3,203,083 | 8/1965 | Obenhaus | 29/588 X |
| 3,226,820 | 1/1966 | Anthony et al. | 29/588 X |

*Primary Examiner*—Charles W. Lanham
*Assistant Examiner*—W. Tupman
*Attorney*—Philip G. Hilbert

[57] ABSTRACT

A process for making semiconductor devices of the type comprising a base portion of copper or copper alloy having a threaded stem portion extending from one side of the base portion, a semiconductor element being mounted on the other side of the base portion, together with a cover member for enclosing the semiconductor element; the cover member being secured to the base portion in a manner to avoid weakening the base portion.

1 Claim, 1 Drawing Figure

PATENTED MAY 22 1973
3,733,691
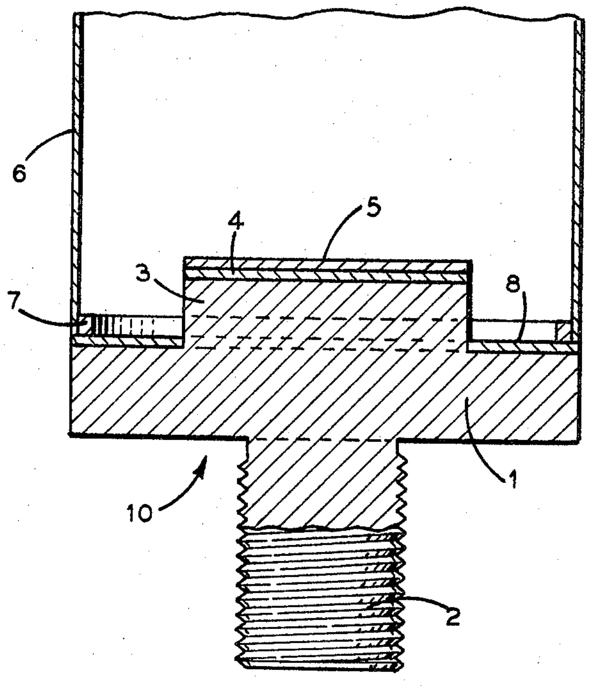
INVENTOR.
Helmut Mann
BY Philip S. Hilbert
ATTORNEY

PROCESS FOR MAKING SEMICONDUCTOR DEVICES

BACKGROUND OF THE INVENTION

Semiconductor devices have been made which are constituted of a base formed from a work hardenable metal such as copper, copper alloy or the like. Such base includes an integral stem portion extending from one side thereof and being threaded for mounting purposes; a semiconductor element being mounted on the other side thereof. A cover member encloses the semiconductor element and is sealed to peripheral portions of the base.

In such known semiconductor devices, the cover is sealed to the base through an intermediate weld ring of nickel plated steel which is secured to the base by means of silver solder, the cover then being secured to the ring by resistance welding. However, such procedure involves heating the base to temperatures of 650° C or more, which causes the base to soften and lose strength.

To overcome these disadvantages it has been suggested that a copper ring be fused to the work hardened base member of copper or copper alloy. The cover member is welded to the relatively soft copper rings by cold welding or compression welding. However, such procedure does not completely remove the adverse effects of raised temperatures on the work hardened base member.

Accordingly, an object of this invention is to provide an improved method of making semiconductor devices of the character described, in which a cover member is secured to a base member of work hardened copper or copper alloy through an intermediate member of steel or the like, which is secured to the base by cold welding; the cover member then being secured to the intermediate member. Thus, high temperatures are avoided which otherwise would adversely affect the hardness and strength of the base member.

Another object of this invention is to provide an improved method of the character described, wherein the cold welding operation for sealing the steel member to the work hardened base member, is effective to further increase the strength of the base member.

Other objects of this invention will in part be obvious and in part hereinafter pointed out.

BRIEF DESCRIPTION OF THE DRAWING

The single FIGURE of the drawing is a vertical sectional view showing a semiconductor device made by the process of the instant invention.

DESCRIPTION OF THE PREFERRED EMBODIMENT

As shown in the drawing, 10 designates a semiconductor device such as a diode, made in accordance with the improved method of the instant invention. Device 10 is formed from a base member 1 having an integral stem portion 2 extending from one side thereof. Member 1 is suitably formed from copper or copper alloy by molding or punching operations which is effective to work harden the same.

Member 1 includes a raised central portion 3 on the other side thereof; the stem 2 being threaded for mounting purposes. On the raised portion 3 of member 1 there is secured a thin disc 4 of molybdenum or the like, by means of silver solder. The semiconductor element 5 of germanium, silicon, or the like, is secured to disc 4 by soft solder. The molybdenum disc 4 provides a conductive layer between semiconductor element 5 and base 1 which has substantially the same expansion coefficient as the element 5; so that the solder connection between the element 5 and base 1 is not disrupted by heat expansion and/or contraction during use of the device.

A cover member 6 for enclosing the semiconductor element 5 is secured to base 1 through an intermediate member 7 which takes the form of a steel ring 7. Ring 7 is secured to the upper face of base member 1 by cold welding. The cold welding operation may be conducted at relatively low pressures by disposing an annular disc of silver foil 8 between ring 7 and the upper surface of member 1. It is understood that with relatively high cold welding pressures, the silver foil 8 may be omitted.

The cover member 6 is then sealed to ring 7 as by welding or soldering.

I claim:

1. A process for making a semiconductor device comprising a work hardened copper alloy base member having an attaching stem extending from one surface portion thereof, said process consisting of securing a semiconductor element to another surface portion of said base member, cold welding a steel connector ring to a peripheral portion of the other surface of the base member with an intermediate layer of silver disposed between said ring and said peripheral base portion, said cold welding operation being conducted at relatively low pressures, and securing the rim portion of a metal cover member to said ring.

* * * * *